United States Patent
Patel et al.

(10) Patent No.: US 9,625,510 B2
(45) Date of Patent: Apr. 18, 2017

(54) VEHICLE ANTENNA DIAGNOSTICS

(71) Applicant: GM GLOBAL TECHNOLOGY OPERATIONS LLC, Detroit, MI (US)

(72) Inventors: Vipul M. Patel, Northville, MI (US); Bruce D. Conner, Ypsilanti, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 14/847,987

(22) Filed: Sep. 8, 2015

(65) Prior Publication Data
US 2017/0067950 A1    Mar. 9, 2017

(51) Int. Cl.
  *G01R 31/11*    (2006.01)
  *G01R 29/10*    (2006.01)
  *H01Q 1/32*    (2006.01)

(52) U.S. Cl.
  CPC ............. *G01R 29/10* (2013.01); *H01Q 1/32* (2013.01)

(58) Field of Classification Search
  None
  See application file for complete search history.

(56) References Cited

U.S. PATENT DOCUMENTS

| | | | |
|---|---|---|---|
| 2006/0197538 A1* | 9/2006 | Leinonen | H01Q 1/243 324/533 |
| 2007/0086349 A1* | 4/2007 | Liu | H04L 41/5038 370/241 |
| 2010/0120415 A1* | 5/2010 | Urquhart | H01Q 1/1257 455/424 |
| 2011/0254677 A1* | 10/2011 | Sun | B60C 23/0437 340/447 |
| 2012/0086612 A1 | 4/2012 | Linehan et al. | |
| 2013/0329820 A1 | 12/2013 | Harel et al. | |
| 2014/0141731 A1 | 5/2014 | Abudul-Gaffoor et al. | |
| 2014/0179239 A1 | 6/2014 | Nickel et al. | |
| 2016/0072594 A1* | 3/2016 | Yuan | H04B 17/16 455/424 |

OTHER PUBLICATIONS

Fanny Mlinarsky "Testing modern MIMO Wi-Fi and LTE radios" Electronic Engineering Times Europe; 2012; pp. 34-35.

* cited by examiner

*Primary Examiner* — Brent Swarthout
(74) *Attorney, Agent, or Firm* — Dierker & Kavanaugh, P.C.

(57) ABSTRACT

In an example of a method for performing vehicle antenna diagnostics, a transmitting and receiving (TX/RX) antenna of a multiple input multiple output (MIMO) antenna assembly of a vehicle is electronically caused to emit a check signal. A response of a receiving only (RX) antenna of the MIMO antenna assembly is electronically detected in response to the check signal. A received signal strength indictor output is generated in response to the response of the RX antenna. The received signal strength indictor output is converted to a digital signal. The integrity of the MIMO antenna is determined after comparing the digital signal with an expected power level of the RX antenna.

18 Claims, 3 Drawing Sheets

VEHICLE ANTENNA DIAGNOSTICS

TECHNICAL FIELD

The present disclosure relates generally to vehicle antenna diagnostics.

BACKGROUND

Vehicles are often equipped with in-vehicle communications platforms (e.g., telematics unit and/or infotainment units) or other in-vehicle controllers that enable hands free calling, vehicle location determination, navigation instruction transmission, and other like features. In-vehicle communications platform or other in-vehicle controllers may be operatively connected to an antenna, which enables the vehicle communications platform to connect to a cellular network in order to enable at least some of these services/features.

SUMMARY

In an example of a method for performing vehicle antenna diagnostics, a transmitting and receiving (TX/RX) antenna of a multiple input multiple output (MIMO) antenna assembly of a vehicle is electronically caused to emit a check signal. A response of a receiving only (RX) antenna of the MIMO antenna assembly is electronically detected in response to the check signal. A received signal strength indictor output is generated in response to the response of the RX antenna. The received signal strength indictor output is converted to a digital signal. The integrity of the MIMO antenna is determined after comparing the digital signal with an expected power level of the RX antenna.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Example(s) of the system and method disclosed herein enable the integrity of an antenna assembly to be analyzed. Analyzing the antenna assembly integrity goes beyond recognizing whether a connection to the antenna has come loose, and actually indicates whether the antenna itself is damaged. The integrity of the antenna assembly may be compromised, for example, when the antenna is cracked or otherwise damaged as a result of an intentional act or an unintentional act (e.g., damage from a car wash, severe weather, etc.). Compromised antenna assembly integrity can deleteriously impact several vehicle operations, including those operations that utilize a cellular or Internet connection.

In the examples disclosed herein, upon recognizing that the integrity of the antenna assembly has been compromised, a vehicle user and/or a vehicle service center may be alerted to the condition with the antenna assembly so that the condition can be addressed.

In the examples disclosed herein, the vehicle antenna diagnostic system includes on-board components alone. This provides for a compact system that can quickly determine the antenna assembly integrity without relying on external parts, user intervention, etc.

Figure 1:
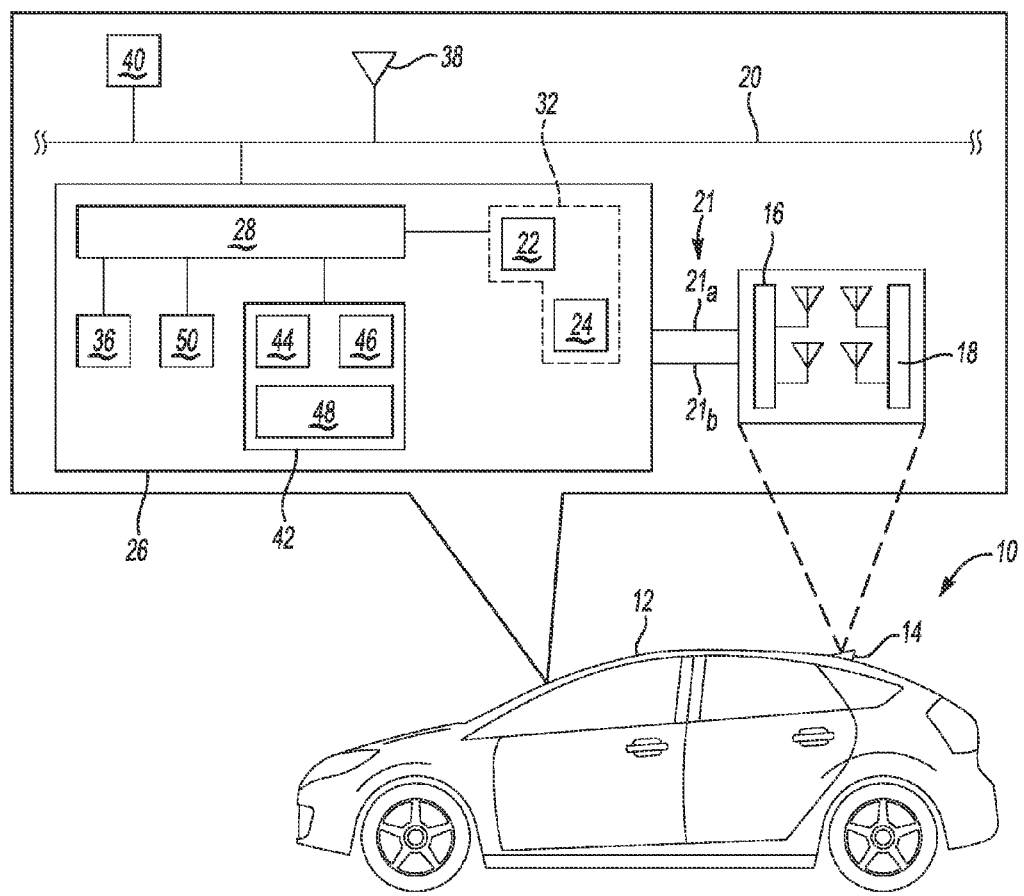
FIG. 1 is a schematic view of an example of a vehicle antenna diagnostic system.

Referring now to FIG. 1, an example of the vehicle antenna diagnostic system 10 is depicted. The system 10 includes the vehicle 12, which may be a car, motorcycle, truck, or recreational vehicle (RV). The vehicle 12 is equipped with suitable hardware and computer readable instructions/code that allow it to communicate (e.g., transmit and/or receive voice and data communications) over a carrier/communication system (described below in reference to FIG. 3) and, in some instances, using short range wireless technology.

The vehicle 12 includes the antenna assembly 14. In an example, the antenna assembly 14 is a multiple-input and multiple-output (MIMO) antenna assembly. The antenna assembly 14 includes a first antenna 16 and a second antenna 18. The first antenna 16 may be a transmitting and receiving (TX/RX) antenna that is capable of transmitting and receiving radio frequency signals. The second antenna 18 may be a receiving only (RX) antenna that is capable of receiving (but not transmitting) radio frequency signals. It is to be understood that either or both of the antennas 16, 18 may be active antenna(s) or passive antenna(s). The first and/or second antenna 16, 18 may be active when it includes an amplifier (not shown). In an example, both the first and second antenna 16, 18 may be passive antennas, and the amplifier may be a component of the antenna assembly 14 or a single hardware component/device 32 (which also includes a diagnostic signal generator 22 and a power detector 24).

The antenna assembly 14 may be positioned on the exterior of the vehicle 12 (e.g., on the roof panel), which acts as a ground plane for the antenna assembly 14. The antenna assembly 14 may be coupled (i.e., electrically connected) to a vehicle communications platform (VCP) 26 via a suitable cable assembly 21. In an example, the cable assembly includes two coaxial cables $21_a$ and $21_b$, one $21_a$ of which connects the first antenna 16 to the VCP 26 and the other $21_b$ of which connects the second antenna 18 to the VCP 26. It is to be understood that the cable assembly 21 may include additional cables, for example, if the antenna assembly 14 includes additional antennas.

The cable $21_a$ enables a diagnostic signal generator 22 (which is part of the VCP 26) to transmit an initiator signal to the first antenna 16, and the cable $21_b$ enables a power detector 24 (which is part of the VCP 26) to detect a response of the second antenna 18.

An example of the diagnostic signal generator 22 is a radio frequency (RF) application specific integrated circuit (ASIC) with amplifiers and filters that perform receive and transmit functions. In an example, the diagnostic signal generator 22 is coupled to, and is responsive to command signal(s) transmitted from, a processing unit 28 of the VCP 26. Upon receiving a command signal from the processing unit 28, the diagnostic signal generator 22 transmits an initiating signal to the first antenna 16. In another example, the diagnostic signal generator 22 includes its own microcontroller that can perform complex operations, including commanding the transmission of the initiating signal.

The first antenna 16 is responsive to the initiating signal from the diagnostic signal generator 22. In response to the initiating signal, the first antenna 16 transmits a radio frequency diagnostic signal (also referred to herein as a check signal). The first antenna 16 may be a transducer, which takes the initiating signal from the diagnostic signal generator 22 and changes it to a format (e.g., electromagnetic waves) that can propagate/radiate through the air. The radio frequency diagnostic signal is the signal in the proper format. When the first antenna 16 is a passive antenna, the antenna 16 radiates the radio frequency diagnostic signal through the air. When the first antenna 16 is an active antenna, the antenna 16 takes the initiating signal from the diagnostic signal generator 22, amplifies the initiating signal, changes it to the radio frequency diagnostic signal, and then radiates it through the air.

It is to be understood that the radio frequency diagnostic or check signal that is emitted/radiated by the first antenna 16 depends upon the initiating signal from the diagnostic signal generator 22, and thus also depends upon the command signal from the processing unit 28 of the VCP 26 or the command signal of the diagnostic signal generator's microcontroller. The processing unit 28 of the VCP or the diagnostic signal generator's microcontroller may be programmed to command the transmission of a non-encoded check signal or an encoded check signal. The diagnostic signal generator 22 generates the appropriate signal and drives this signal to the first antenna 16. The non-encoded radio frequency diagnostic or check signal includes no code (i.e., encoded information) and has a low to medium power level. As an example, the low to medium power level of the non-encoded check signal ranges from about 0.5 W to about 1 W. The encoded radio frequency diagnostic or check signal includes test code information that indicates to the antenna assembly 14 that the received signal is a test. The test code information may be included in the check signal by the diagnostic signal generator 22. Any code that would not be confused as a cellular signal may be used in the test code information. The encoded radio frequency diagnostic signal also has a low to medium power level, and in some instances, can be lower than 0.5 W.

The second antenna 18 receives and responds to the radio frequency diagnostic signal of the first antenna 16. The second antenna 18 intercepts at least some of the power of the radio frequency diagnostic signal and produces a voltage at its terminals. This voltage may be applied to a receiver to be amplified. As such, the output or response of the second antenna 18 may be in the form of a voltage.

The response of the second antenna 18 is detectable by the power detector 24. The power detector 24 is coupled to the cable 21$_b$ and is capable of determining the voltage on the antenna 18. The power detector 24 may include discrete circuitry (alone or as part of an ASIC) that detects/measures the voltage response of the antenna 18. The detected voltage may be output by the power detector 24 as a received signal strength indicator (RSSI) output. In other words, the RSSI output is a signal that indicates the voltage of the second antenna 18.

In some examples, the diagnostic signal generator 22 and the power detector 24 may be separate hardware components/devices of the VCP 26, each of which is programmed to perform the respective functions disclosed herein. In other examples, the diagnostic signal generator 22 and the power detector 24 may be integrated into a single hardware component/device (shown as 32 in FIG. 1), which is part of the VCP 26. The integrated diagnostic signal generator and power detector device 32 may be a RF ASIC that sends the initiating signal to the first antenna 16, detects the voltage of the second antenna 18, and generates the RSSI output.

In one example, the power detector 24 transmits the RSSI output to the processing unit 28 of the VCP 26 for conversion and further processing. In another example, the power detector 24 may include circuitry for performing an analog to digital conversion, and thus may convert the RSSI output to a digital signal. In this other example, the power detector 24 transmits the digital signal to the processing unit 28 of the VCP 26 for further processing.

The system 10 also includes the previously mentioned VCP 26. The VCP 26 is connected to the other vehicle components through a vehicle bus 20.

The vehicle bus 20 may utilize a variety of networking protocols, such as a controller area network (CAN), a media oriented system transfer (MOST), a local interconnection network (LIN), an Ethernet, TCP/IP, and other appropriate connections such as those that conform with known ISO, SAE, and IEEE standards and specifications, to name a few. The vehicle bus 20 enables the vehicle 12 to send signals (e.g., real-time bus messages, alert notifications) from the vehicle communications platform (VCP) 26 to various units of equipment and systems both outside the vehicle 12. The vehicle bus 20 also enables the vehicle 12 to receive signals at the VCP 26 from various units of equipment and systems both outside the vehicle 12 and within the vehicle 12. Examples of these communications will be discussed further in reference to FIG. 3.

In an example, the VCP 26 is an on-board vehicle dedicated communications and entertainment device. In another example (not shown), the VCP 26 is an on-board vehicle dedicated communications device (e.g., a telematics unit), and the vehicle 12 includes a separate on-board vehicle dedicated entertainment device (e.g., an infotainment unit). Whether integrated into a single unit (e.g., VCP 26) or included as separate units, the on-board vehicle dedicated communications and entertainment device(s) include hardware components that are capable of running computer readable instructions/code, which are embodied on non-transitory, tangible computer readable media.

In the examples disclosed herein, the VCP 26 includes the processing unit 28. As shown in FIG. 1, the VCP 26 is operatively coupled to one or more types of electronic memory 36. In an example, the processing unit 28 is a microprocessor. In other examples, the processing unit 28 may be a micro controller, a controller, and/or a host processor. In still another example, processing unit 28 may be an application specific integrated circuit (ASIC). The electronic memory 36 of the VCP 26 may be an encrypted memory that is configured to store i) computer readable instructions/code to be executed by the processing unit 28, ii) data associated with the various systems of the vehicle 12 (i.e., vehicle data, VIN, etc.), iii) fault codes that are associated with particular power level values, and/or the like. The electronic memory 54 may be a non-transitory, tangible computer readable media (e.g., RAM).

As mentioned above, in some examples, the VCP 26 (through the processing unit 28 executing computer readable instructions/code) transmits the command signal to the diagnostic signal generator 22 to initiate the diagnostic check of the antenna assembly 14. In one example, the processing unit 28 may be programmed to command the transmission of the non-encoded check signal, and in another example, the processing unit 28 may be programmed to command the transmission of the encoded check signal The processing unit 28 may be programmed to initiate the diagnostic check periodically, or in response to a triggering event. As examples, the processing unit 28 may be programmed to initiate the diagnostic check every preset number of vehicle start up events (e.g., every $3^{rd}$ vehicle start up event) or every preset number of minutes (e.g., every 60 minutes as long as the vehicle 12 is in an ON state). As another example, the triggering event may be the vehicle start up event (e.g., vehicle ignition turned on, electronic vehicle powered up, etc.). In this example, the integrity of the antenna assembly 14 would be checked every time the vehicle 12 is started. Upon recognizing that the periodic check is due or that the triggering event has taken place, the processing unit 28 transmits the command signal to the diagnostic signal generator 22 to initiate the diagnostic check of the antenna assembly 14.

In the examples disclosed herein, the VCP 26 is also responsive to the RSSI output or the digital signal, which is received at the processing unit 28 from the power detector 24. The processing unit 28 of the VCP 26 includes circuitry for performing an analog to digital conversion. As such, when the VCP 26 receives the RSSI output, the processing unit 28 may first convert the RSSI output to the digital signal. When the VCP 26 receives the digital signal, the processing unit 28 may be programmed to bypass the conversion.

When the digital signal is received or generated, the processing unit 28 analyzes the digital signal, and based upon this analysis, determines the integrity of the antenna assembly 14. Depending upon the determination, the processing unit 28 can respond in a variety of ways. In some examples, the processing unit 28 may cause other in-vehicle systems to perform some action.

To analyze the digital signal, the processing unit 28 may be programmed to compare the digital signal with an expected power level (i.e., a calibration value) of the second antenna 18. In an example then, the processing unit 28 may include circuitry to compare the digital signal with the expected power level. The expected power level may be stored in a memory 36 of the VCP 26. In an example, the expected power level may be a threshold calibration value, and any digital signal having a calibration value below or above the threshold calibration value indicates that the integrity of the antenna assembly 14 has been compromised. In another example, the expected power level may encompass a table of calibration values (each of which indicates a different integrity level of the antenna assembly 14), and the calibration value that matches or is nearest to the digital signal indicates the integrity of the antenna assembly 14.

After performing the comparison, the VCP 26 is capable of determining the integrity of the antenna assembly. When the threshold calibration value is utilized for the comparison, the results indicate to the VCP 26 that the antenna assembly 14 is in working order (i.e., digital signal is at the expected threshold value), or that the integrity of the antenna assembly 14 has been compromised (i.e., digital signal is below or above the expected threshold value). When the table of calibration values is utilized, the comparison results include the calibration value that matches or is nearest to the digital signal. The calibration value may indicate how much, if at all, the integrity of the antenna assembly 14 has been compromised.

In some instances, the VCP 26 determines that the antenna assembly 14 is in working order and that the integrity of the antenna assembly 14 is not compromised. In these examples, the VCP 26 may do nothing, may store the comparison results and time/date of the check in a log in its memory 36, or may transmit the comparison results and time/date of the check to a vehicle service center for storage in a vehicle profile.

Figure 3:
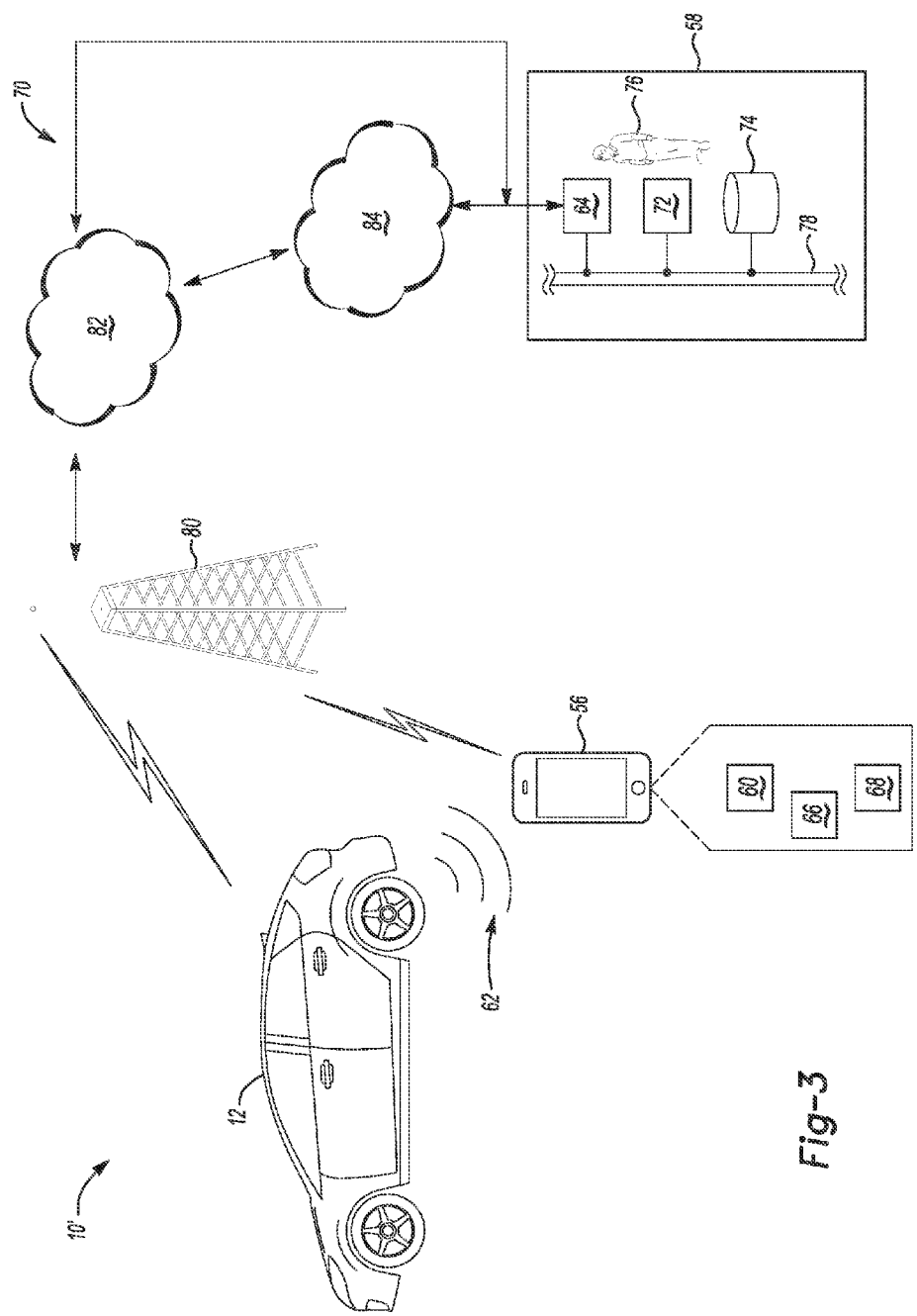
FIG. 3 is a schematic view of an example of the vehicle antenna diagnostic system in communication with a mobile device and/or a vehicle service center.

In other instances, the VCP 26 determines that the antenna assembly 14 is not in working order and that the integrity of the antenna assembly 14 has been compromised. In these examples, the VCP 26 may be programmed to transmit an antenna alert within the vehicle 12, to identify a fault code that is associated with the calibration value that matches or is nearest to the digital signal, and/or to generate an antenna alert message and transmit the alert message to another device (e.g., a mobile device or a vehicle service center, both of which are shown in FIG. 3).

When the VCP 26 is programmed to transmit an antenna alert within the vehicle 12, the processing unit 28 executes suitable computer readable instructions/code (which are stored in the memory 36) to generate the antenna alert. In one example, the antenna alert may be an audible message that informs the in-vehicle user that the antenna assembly 14 should be serviced. The VCP 26 may retrieve a prerecorded audible message from the memory 36, and then may cause this audible message to be played over an in-vehicle speaker 38 using an audio bus system (not shown). The VCP 26 may also transmit a message to another in-vehicle module which stores prerecorded audible messages, and then may cause the module to play the audible message over an in-vehicle speaker 38 using the audio bus system. In another example, the antenna alert may be a video or graphical message that informs the in-vehicle user that the antenna assembly 14 should be serviced. The VCP 26 may retrieve a saved video or graphical message from the memory 36, and then may cause this video or graphical message to be displayed on an in-vehicle display 40. In an example, the display 40 is a full-color touch screen display. Other examples of the display 40 include a VFD (Vacuum Fluorescent Display), an LED (Light Emitting Diode) display, an LCD (Liquid Crystal Diode) display, and/or the like.

When the VCP 26 is programmed to identify the fault code, the processing unit 28 utilizes the calibration value that matches or is nearest to the digital signal, which indicates how much the integrity has been compromised. The memory 36 may have a data table stored therein. The data table may include multiple fault codes, each of which is associated with a potential condition with the antenna assembly. For example, one fault code may indicate that the first antenna 16 and/or second antenna 18 has minor damage, and another fault code may indicate that the first antenna 16 and/or second antenna 18 has severe damage. As other examples, still another fault code may indicate that the antennas 16, 18 are too close to one another, and yet another fault code could indicate that one of the two antennas 16, 18 is totally damaged. The assessed level of damage may be based upon the calibration value. Different calibration values may be associated with different damage levels, which may be associated with different fault codes. Within the data table, each of the fault codes may be linked to the calibration values that indicate the integrity of the antenna assembly. The VCP 26 may be programmed to run a query in the data table using the calibration value associated with the digital signal. The query will retrieve the fault code associated with the calibration value.

The VCP 26 may store the fault code and time/date of the integrity check in the log in its memory 36, or may transmit the fault code and time/date of the integrity check to a vehicle service center for storage in a vehicle profile.

When the VCP 26 is programmed to transmit an antenna alert message to another device, the processing unit 28 executes suitable computer readable instructions/code (which are stored in the memory 36) to determine whether the message should be transmitted via a cellular or Internet connection or via a short range wireless connection. In an example, the VCP 26 may recognize (from the value contained within the integrity signal) that the integrity of the antenna assembly 14 has been compromised to the point of being unsuitable for cellular or Internet communications, and may transmit the antenna alert message to the mobile device using short range communications when the mobile device is paired with the VCP 26 and is within a short range wireless communication distance (e.g., 100 meters or less) of the VCP 26. In another example, the VCP 26 may recognize (from the value contained within the integrity signal) that the integrity of the antenna assembly 14 has not been compromised to the point of being unsuitable for cellular or Internet communications. In this example, the VCP 26 may be programmed to automatically transmit the antenna alert message to a server of the vehicle service center. In this example, the VCP 26 may alternatively be programmed to first determine whether a paired mobile device is within a short range wireless communication distance of the VCP 26. In this example, when the mobile device is recognized by the VCP 26, the VCP 26 may transmit the antenna alert message to the mobile device using short range wireless communications. In this example, when the mobile device is not recognized by the VCP 26, the VCP 26 may transmit the antenna alert message to the server of the vehicle service center using the cellular or Internet connection.

The antenna alert message may be a text message, a short message service (SMS) message, a data packet message, or any other message that informs the mobile device user or an advisor at the vehicle service center that the antenna assembly 14 should be serviced.

It is to be understood that when the VCP 26 transmits the integrity signal, or the fault code, or the antenna alert message, or any other message(s) to another device/entity, the VCP 26 utilizes the communications module 42. The communications module 42 may include a cellular chipset/component 44 for voice communications, a data transmission system 46 for data transmission, and a short range wireless communication system 48 for short range wireless communications.

The cellular chipset/component 44 of the VCP 26 may be a dual-mode, dual-band, multi-mode and/or multi-band wireless transceiver that works in conjunction with the antenna assembly 14. The cellular chipset/component 44 uses one or more prescribed frequencies in standard analog and/or digital bands in the current market for cellular systems. Any suitable protocol may be used, including digital transmission technologies, such as TDMA (time division multiple access), CDMA (code division multiple access), W-CDMA (wideband CDMA), FDMA (frequency-division multiple access), OFDMA (orthogonal frequency-division multiple access), etc.

In an example, the data transmission system 46 may include a packet builder, which is programmed to make decisions about what packet to send (e.g., bandwidth, data to include, etc.) and to actually build a packet data message. In another example, the data transmission system 46 may include a wireless modem, which applies some type of encoding or modulation to convert the digital data so that it can communicate through a vocoder or speech codec incorporated in the cellular chipset/component 44. It is to be understood that any suitable encoding or modulation technique that provides an acceptable data rate and bit error may be used with the examples disclosed herein. While examples have been provided, it is to be understood that any suitable data transmission system 46 may be used.

The communications module 42 may also include a short range wireless communication unit 48, which is configured for short-range wireless communication technologies. Examples of other short-range wireless communication technologies includes standard BLUETOOTH® and various classes thereof (e.g., low energy), dedicated short-range communications (DSRC), or WI-FI™ and various classes thereof.

The VCP 26 may also include a real time clock 50. The real-time clock (RTC) 50 provides accurate date and time information to the VCP 26 hardware and software components that may require and/or request date and time information. In an example, the RTC 50 may provide the time and/or date information for the antenna assembly integrity check.

While not shown, it is to be understood that the VCP 26 may include other components that are not shown, such as a location detection unit (e.g., a GPS receiver, a radio triangulation system, a dead reckoning position system, and/or combinations thereof).

Figure 2:
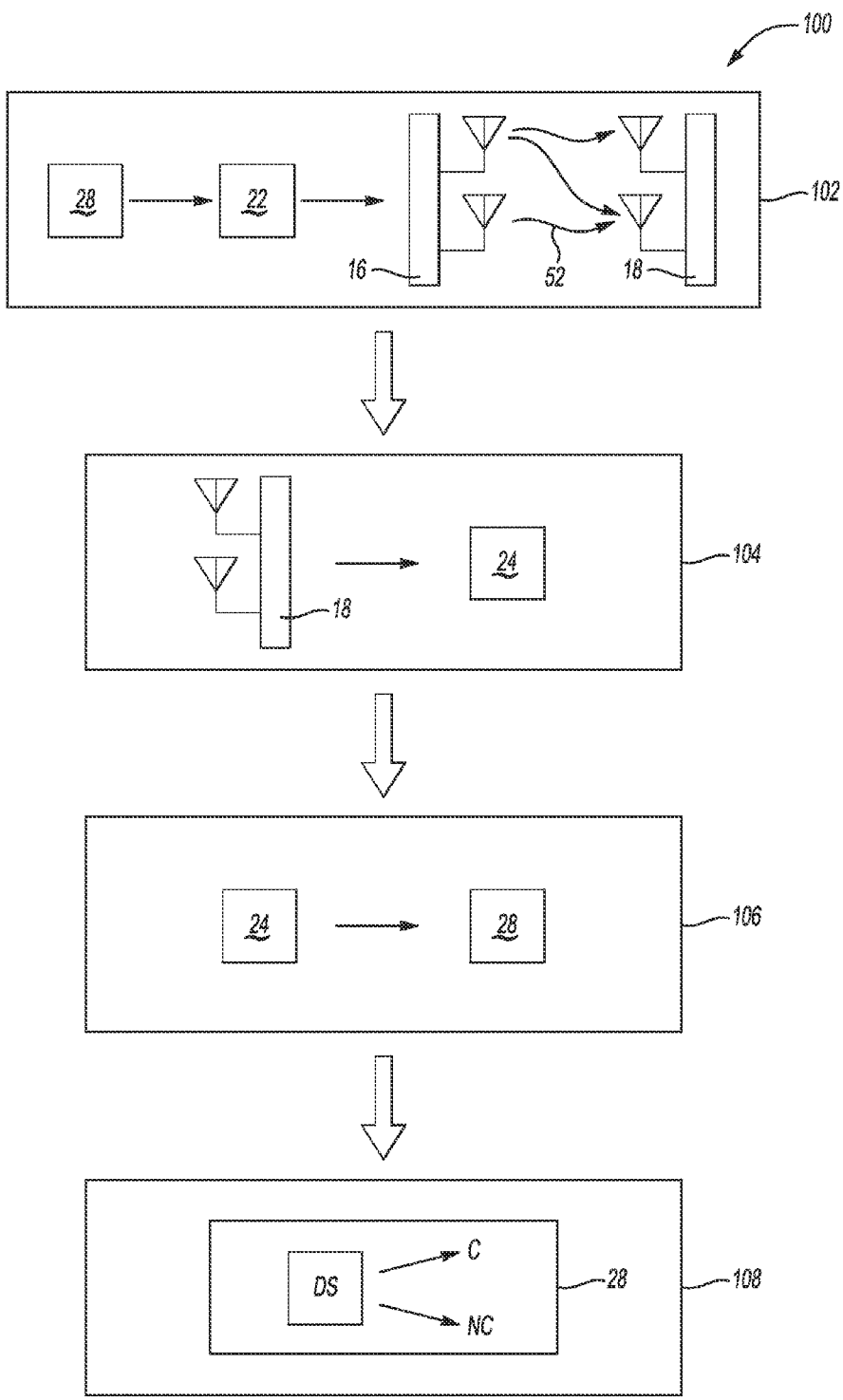
FIG. 2 is a flow diagram illustrating an example of a method for performing vehicle antenna diagnostics.

Components of the system 10 may perform vehicle antenna diagnostics. An example of the method 100 for performing vehicle antenna diagnostics is shown in FIG. 2. At reference numeral 102 in FIG. 2, the diagnostic signal generator 22 (in response to a command from the processing unit 28) electronically causes the first antenna 16 (e.g., TX/RX antenna of a MIMO antenna assembly) to emit the radio frequency diagnostic signal/check signal 52. At reference numeral 102, the second antenna 18 (e.g., RX antenna of the MIMO antenna assembly) also receives the emitted radio frequency diagnostic signal/check signal 52.

At reference numeral 104, the power detector 24 detects the response (e.g., a voltage or RSSI output) of the second antenna 18 in response to the radio frequency diagnostic signal/check signal 52. As previously described, the power detector 24 is capable of transmitting the RSSI output to the processing unit 28, or is capable of converting the RSSI output to a digital signal and then transmitting the digital signal to the processing unit 28.

As mentioned above, the processing unit 28 is responsive to the RSSI output or digital signal from the power detector 24. At reference numeral 106 of FIG. 2, the processing unit 28 receives/detects the digital signal and compares this signal with the expected power level (e.g., a threshold value or a table of values) of the second antenna 18. Based upon the comparison (as shown at reference numeral 108), the processing unit 28 determines the integrity (i.e., compromised C or not compromised NC) of the digital signal.

The VCP 26 may then do nothing or may undergo further processing. Examples of the further processing may include storage of the comparison results and time/date of the check in a log in the memory 36, transmission of the comparison results and time/date of the check to a vehicle service center for storage in a vehicle profile, transmission of the antenna alert within the vehicle 12, identification (and storage or transmission) of the fault code that is associated with the calibration value that corresponds with the digital signal, and/or generation and transmission of the antenna alert message to another device (e.g., a mobile device or a vehicle service center).

When message(s) are to be sent to the mobile device and/or to the server of the vehicle service center, the system 10 shown in FIG. 1 may include additional components. An example of this system 10' is shown in FIG. 3, and includes both the mobile device 56 and the vehicle service center 58.

In the examples disclosed herein, the mobile device 56 may be a smart phone, such as a GSM/LTE phone or a GSM/CDMA/LTE phone. In other examples, the mobile device 56 may be any portable device that is capable of short range and cellular/Internet communications. Examples of other mobile devices 56 include a wearable device (e.g., foot pod, smart bracelet, smart watch, helmet, etc.), a tablet computer, a key fob, etc.

As mentioned above, any of the data or messages may be sent from the VCP 26 to the mobile device 56 using short range wireless communication technologies. This type of communication may be used as the default mode of communication when the mobile device 56 is recognized by the VCP 26 as being a paired device that is within a suitable short range distance and/or when the calibration value indicates that the antenna assembly 14 is damaged (and thus cannot be used for cellular/Internet communications).

The short range wireless communications may take place between the short range wireless communication system 48 of the vehicle's communications module 42 and a short range wireless communication system 60 of the mobile device 56. In an example, the short range wireless communication systems 48 of the vehicle 12 and the mobile device 56 respectively include a low energy, short-range wireless communication module. In one example, each of the low energy, short-range wireless communication modules is a BLUETOOTH® LE or BLE module. Each of these modules includes a respective transceiver (or a transmitter and a receiver) and a respective node. Each transceiver includes a respective signal emitter for transmitting signals/data and a respective signal receiver for receiving signals/data. The respective nodes allow the modules of the systems 48, 60 to communicate, via a short-range wireless communication link 62, with other device(s) that are low energy, short-range wireless communication enabled. The node provides the autonomous communication link 62 with the other enabled device(s) after an initial pairing between the two modules. The nodes may be standalone chipsets/modems, or may be integrated as part of the transceiver, or may be integrated as part of any other circuit in the module.

It is to be understood that each of the modules in the systems 48, 60 has a unique identifying code (e.g., a wireless connection key) that is used to pair the respective module with a module of another enabled device. Two devices (VCP 26 and mobile device 56) are paired with each other when the modules of those devices exchange their unique identifying codes with each other. For example, the module in the vehicle 12 and the module in the mobile device 56 are paired when they exchange their unique identifying codes with each other. This enables the vehicle 12 (through VCP 26) and the mobile device 56 to communicate typically under a secured connection (e.g., autonomous communication link 62).

When the mobile device 56 receives a message from the VCP 26 regarding the antenna assembly (e.g., a message including the calibration value, the fault code, or information that the antenna assembly 14 should be serviced), the mobile device 56 may forward this message on to the server 64 of the vehicle service center 58. The message received by the mobile device 56 may include forwarding information (i.e., so the mobile device 56 knows which server 64 is to receive the message) and vehicle information (i.e., so that the server 56 receiving the message knows which vehicle 12 sent the message).

To send the message to the server 64, the mobile device 56 may utilize its cellular chipset/component 66 and/or data transmission system 68. This message may be sent over a carrier/communication system 70 (described in more detail below).

In other examples, the data or messages may be sent from the VCP 26 to the server 64 using cellular and/or Internet connections. This type of communication may be used as the default mode of communication when the determination is made that the integrity of the antenna assembly 14 is not compromised and the information is to be transmitted to the server 64, or when the calibration value indicates that the antenna assembly 14 is slightly damaged, and thus can still be used for cellular/Internet communications).

It is to be understood that the vehicle service center 58 shown in FIG. 3 may be virtualized and configured in a Cloud Computer, that is, in an Internet-based computing environment. For example, the server 64 (and other computing equipment) may be accessed as a Cloud platform service, or PaaS (Platform as a Service), utilizing Cloud infrastructure rather than hosting server 64 at the center 58. In these instances, the server 64 (and other center 58 components) may be virtualized as a Cloud resource. The Cloud infrastructure, known as IaaS (Infrastructure as a Service), typically utilizes a platform virtualization environment as a service, which may include components such as processor(s) 72, database(s) 74, server 64, and other computer equipment.

The server 64 may be a system of computer hardware and computer readable instructions that is capable of receiving the messages from the mobile device 56 or from the VCP 26, and saving these messages in a profile associated with the vehicle 12 and/or forwarding the messages to an advisor 76 who can contact the vehicle user regarding the antenna assembly 14.

The server 64 may include a processor (not shown), and the center 58 may also include additional processor(s) 72. The processors 72 may be a controller, a host processor, an ASIC, or a processor working in conjunction with a central processing unit (CPU). The server 64 also includes a server communication transceiver (not shown) that is in selective communication with both the VCP 26 and the mobile device communication components 66, 68. The server communication transceiver may be any suitable data transmission system that is capable of sending and/or receiving data communications over the carrier/communication system 70.

The database(s) 74 may be designed to store vehicle record(s), subscriber/user profile records, or any other pertinent subscriber and/or vehicle information and/or mobile communications device information. In an example, the database(s) 78 may be configured to store the user profile, which may contain personal information of the subscriber (e.g., the subscriber's name, the garage address and/or preset ranges of the vehicle 12, a billing address, a home phone number, a cellular phone number, etc.) and/or information of the vehicle 12 (e.g., identification number, antenna assembly information, etc.).

As illustrated in FIG. 3, the various center components may be coupled to one another via a network connection or bus 78 such as one similar to the vehicle bus 20 previously described.

In some of the examples disclosed herein, phone calls and/or data (e.g., antenna alert messages, etc.) may be transmitted to, from, and/or between communication component(s) of the vehicle 16, the mobile device 56, and/or the server 64 using the carrier/communication system 70. Some of these communication links between the various components are shown as lightning bolts and arrows in FIG. 3.

In an example, the carrier/communication system 70 is a two-way radio frequency (RF) communication system. The carrier/communication system 70 may include one or more cell towers 80 or satellites (not shown). It is to be understood that the carrier/communication system 70 may include one or more evolved Node Bs (eNodeB) and evolved packet cores (EPC) 82 (for a 4G (long-term evolution, LTE) network), and/or one or more land networks 84. The carrier/communication system 80 may be part of a cellular radio environment or a satellite radio environment, which may include a variety of wireless network providers (which include mobile network operator(s), not shown), utilizing the same or a variety of radio access technologies. While several examples have been provided, it is to be understood that the architecture of the wireless carrier/communication system 80 may be GSM (global system for mobile telecommunications), CDMA2000, UMTS (universal mobile telecommunications system), LTE, or some other available architecture.

An Internet connection may also be utilized for the transmission of message(s) between the VCP 26 and the server 64 or between the mobile device 56 and the server 54. In this example, the transmission of the message(s) may be made using the carrier/communication system 60, either through the vehicle's Internet connection (e.g., when the vehicle 12 is equipped with a 4G long-term evolution, LTE, or other suitable Internet connection) or through the mobile device's cellular and Internet connection.

It is to be understood that the term "communication" as used herein is to be construed to include all forms of communication, including direct and indirect communication. Indirect communication may include communication between two components with additional component(s) located therebetween.

Further, the terms "connect/connected/connection" and/or the like are broadly defined herein to encompass a variety of divergent connected arrangements and assembly techniques. These arrangements and techniques include, but are not limited to (1) the direct communication between one component and another component with no intervening components therebetween; and (2) the communication of one component and another component with one or more components therebetween, provided that the one component being "connected to" the other component is somehow in operative communication with the other component (notwithstanding the presence of one or more additional components therebetween).

It is to be understood that the ranges provided herein include the stated range and any value or sub-range within the stated range. For example, a range of 100 meters or less should be interpreted to include the explicitly recited limits of 100 meters or less, as well as individual values, such as 80 meters, 45 meters, 15.5 meters, etc., and sub-ranges, such as from about 5 meters to about 40 meters, from about 10 meters to about 35 meters, etc. Furthermore, when "about" is utilized to describe a value, this is meant to encompass minor variations (up to +/−10%) from the stated value.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

In describing and claiming the examples disclosed herein, the singular forms "a", "an", and "the" include plural referents unless the context clearly dictates otherwise.

While several examples have been described in detail, it is to be understood that the disclosed examples may be modified. Therefore, the foregoing description is to be considered non-limiting.

The invention claimed is:

1. A method for performing vehicle antenna diagnostics, comprising:
electronically causing a transmitting and receiving (TX/RX) antenna of a multiple input multiple output (MIMO) antenna assembly of a vehicle to emit a check signal;
electronically detecting a response of a receiving only (RX) antenna of the MIMO antenna assembly in response to the check signal;
generating a received signal strength indictor output in response to the response of the RX antenna;
converting the received signal strength indictor output to a digital signal; and
determining an integrity of the MIMO antenna after comparing the digital signal with an expected power level of the RX antenna, the determining including:
recognizing a calibration value that corresponds with the digital signal;
running a query in a data table using the calibration value, thereby identifying a fault code associated with the calibration value; and
from the fault code, identifying a potential condition of the MIMO antenna assembly, the potential condition being selected from the group consisting of minor damage, severe damage, total damage, and the TX/RX antenna and the RX antenna being too close to one another.

2. The method as defined in claim 1 wherein the electronically causing includes commanding a diagnostic signal generator to transmit an initiating signal, and wherein the TX/RX antenna is responsive to the initiating signal by emitting a non-encoded check signal at a power level ranging from about 0.5 W to about 1 W.

3. The method as defined in claim 1 wherein the electronically causing includes commanding a diagnostic signal generator to transmit an initiating signal, and wherein the TX/RX antenna is responsive to the initiating signal by emitting an encoded check signal including test code information.

4. The method as defined in claim 1, further comprising:
recognizing that the digital signal is below the expected power level of the RX antenna; and
causing an antenna alert to be displayed on an in-vehicle display.

5. The method as defined in claim 1, further comprising one of:
storing the fault code; or
transmitting the fault code to a vehicle service center.

6. The method as defined in claim 1 wherein prior to the electronically causing, the method further comprising recognizing a vehicle start up event.

7. A vehicle antenna diagnostic system, comprising:
a multiple input multiple output antenna (MIMO) assembly including a transmitting and receiving (TX/RX) antenna and a receiving only (RX) antenna; and a vehicle communications platform electrically connected to the MIMO assembly, the vehicle communications platform including:
an electronic memory;
a radio frequency application specific integrated circuit (RF ASIC);
a power detector to generate a received signal strength indictor output in response to a response of the RX antenna; and
a processing unit programmed to:
command the RF ASIC to transmit a signal that causes the TX/RX antenna to emit a check signal;
receive, from the power detector, the received signal strength indictor output;
convert the received signal strength indictor output to a digital signal; and
determine the integrity of the MIMO assembly after comparing the digital signal with an expected power level of the RX antenna, wherein the integrity is determined by:
recognizing a calibration value that corresponds with the digital signal;
running a query in a data table using the calibration value, thereby identifying a fault code associated with the calibration value; and
from the fault code, identifying a potential condition of the MIMO antenna assembly, the potential condition being selected from the group consisting of minor damage, severe damage, total damage, and the TX/RX antenna and the RX antenna being too close to one another.

8. The vehicle antenna diagnostic system as defined in claim 7 wherein the TX/RX antenna emits a non-encoded check signal at a power level ranging from about 0.5 W to about 1 W.

9. The vehicle antenna diagnostic system as defined in claim 7 wherein the TX/RX antenna emits an encoded check signal including test code information.

10. The vehicle antenna diagnostic system as defined in claim 7, further comprising an in-vehicle display, and wherein the processing unit is further programmed to
cause an antenna alert to be displayed on the in-vehicle display.

11. The vehicle antenna diagnostic system as defined in claim 7, further comprising:
a server of a vehicle service center; and
a communications module of the vehicle communications platform;
wherein:
the processing unit is further programmed to command the communications module to transmit the fault code to the server.

12. The vehicle antenna diagnostic system as defined in claim 7, further comprising:
a short range wireless communications unit of the vehicle communications platform; and
a mobile device that is connected to the short range wireless communications unit;
wherein the processing unit is further programmed to command the short range wireless communications unit to transmit an antenna alert message to the mobile device.

13. A vehicle antenna diagnostic system, comprising:
an antenna assembly including a first antenna for transmitting and receiving radio frequency signals and a second antenna for receiving radio frequency signals;
a diagnostic signal generator coupled to the antenna assembly, wherein the first antenna responds to the diagnostic signal generator to transmit a radio frequency diagnostic signal;
a power detector coupled to the antenna assembly, wherein the second antenna responds to the radio frequency diagnostic signal and the power detector responds to a second antenna response of the radio frequency diagnostic signal with a received signal strength indictor output; and
a processing unit of a vehicle communications platform responsive to the received signal strength indictor output to provide a determination as to an integrity of the antenna assembly, wherein the processing unit is programmed to:
receive, from the power detector, the received signal strength indictor output convert the received signal strength indictor output to a digital signal; and
determine the integrity of the antenna assembly by:
recognizing a calibration value that corresponds with the digital signal;
running a query in a data table using the calibration value, thereby identifying a fault code associated with the calibration value; and
from the fault code, identifying a potential condition of the antenna assembly, the potential condition being selected from the group consisting of minor damage, severe damage, total damage, and the TX/RX antenna and the RX antenna being too close to one another.

14. The vehicle diagnostic system as defined in claim 13 wherein the diagnostic signal generator and the power detector are integrated in a single device.

15. The vehicle diagnostic system as defined in claim 13 wherein the diagnostic signal generator, the power detector, and the processing unit are integrated in the vehicle communications platform.

16. The vehicle diagnostic system as defined in claim 13 wherein the processing unit is further programmed to command the diagnostic signal generator to transmit an initiating signal that causes the first antenna to transmit the radio frequency diagnostic signal.

17. The method as defined in claim 1 wherein the data table stores multiple fault codes and associated potential conditions, including:
a first fault code indicating that one of the TX/RX antenna and the RX antenna has the minor damage;
a second fault code indicating that one of the TX/RX antenna and the RX antenna has the severe damage;
a third fault code indicating that one of the TX/RX antenna and the RX antenna has the total damage; and
a fourth fault code indicating that the TX/RX antenna and the RX antenna are too close to one another.

18. The vehicle antenna diagnostic system as defined in claim 7 wherein the data table stores multiple fault codes and associated potential conditions, including:
a first fault code indicating that one of the TX/RX antenna and the RX antenna has the minor damage;
a second fault code indicating that one of the TX/RX antenna and the RX antenna has the severe damage;
a third fault code indicating that one of the TX/RX antenna and the RX antenna has the total damage; and
a fourth fault code indicating that the TX/RX antenna and the RX antenna are too close to one another.

* * * * *